United States Patent
Irace et al.

(10) Patent No.: US 8,274,128 B2
(45) Date of Patent: Sep. 25, 2012

(54) SEMICONDUCTOR DEVICE WITH BUFFER LAYER

(75) Inventors: Andrea Irace, Naples (IT); Giovanni Breglio, Naples (IT); Paolo Spirito, Naples (IT); Andrea Bricconi, Villach (AT); Diego Raffo, Redondo Beach, CA (US); Luigi Merlin, Turin (IT)

(73) Assignee: Siliconix Technology C. V. IR, Singapore (SG)

( * ) Notice: Subject to any disclaimer, the term of this patent is extended or adjusted under 35 U.S.C. 154(b) by 263 days.

(21) Appl. No.: 12/054,291

(22) Filed: Mar. 24, 2008

(65) Prior Publication Data

US 2009/0224355 A1    Sep. 10, 2009

Related U.S. Application Data

(60) Provisional application No. 60/919,698, filed on Mar. 23, 2007.

(51) Int. Cl.
*H01L 29/47*    (2006.01)

(52) U.S. Cl. ............. 257/475; 257/E27.04; 257/E29.013
(58) Field of Classification Search .................. 257/475, 257/E27.04, E29.013
See application file for complete search history.

(56) References Cited

U.S. PATENT DOCUMENTS

| | | | |
|---|---|---|---|
| 4,284,997 A | | 8/1981 | Nishizawa |
| 4,375,124 A | | 3/1983 | Cogan |
| 4,587,712 A | | 5/1986 | Baliga |
| 5,766,966 A | | 6/1998 | Ng |
| 6,040,600 A | | 3/2000 | Uenishi et al. |
| 6,140,679 A | | 10/2000 | Ferla et al. |
| 6,768,170 B2 | | 7/2004 | Zhou |
| 2004/0063288 A1* | | 4/2004 | Kenney et al. ................. 438/301 |
| 2006/0049464 A1* | | 3/2006 | Rao ............................... 257/371 |
| 2007/0228505 A1* | | 10/2007 | Mazzola et al. ............... 257/471 |

* cited by examiner

*Primary Examiner* — Lex Malsawma

(57) ABSTRACT

A semiconductor device in one embodiment includes a depletion junction, a peripheral region adjacent the depletion junction, and a buffer layer. The buffer layer is adapted to reduce localization of avalanche breakdown proximate the interface between the depletion junction and the peripheral region.

15 Claims, 5 Drawing Sheets

SEMICONDUCTOR DEVICE WITH BUFFER LAYER

CROSS-REFERENCE TO RELATED APPLICATIONS

This claims the benefit of U.S. Provisional Application No. 60/919,698 filed Mar. 23, 2007, which is incorporate herein by reference.

BACKGROUND OF THE INVENTION

A Schottky diode has a low forward voltage drop and a very fast switching action that may be utilized in switched mode power supplies and the like. The Schottky diode uses a metal semiconductor junction as illustrated in FIG. 1. A high-power Schottky diode according to the conventional art includes first and second semiconductor layers 105, 110, a guard implant region 115, a termination oxide layer 120, a first metal layer 125, and a second metal layer 130. The first metal layer 125 and the doping concentration of the second semiconductor layer 110 are selected to form a Schottky junction 135 at the interface between the first metal layer 125 and the second semiconductor layer 110. Accordingly, the first metal layer 125 forms the anode, and the first semiconductor layer 105, second semiconductor layer 110 and second metal layer 130 form the cathode 140 of the Schottky diode.

The termination oxide layer 120 and guard implant region 115 form the termination region of the device. The termination region 115, 120 protects the device against avalanche breakdown during reverse bias conditions. The termination region 115, 120 is usually dimensional and designed just to sustain the desired breakdown voltage. The current capacity of the termination region 115, 120 is limited by its reduced area. The limited current capability in turn limits the overall reverse performance of the device. Accordingly, there is a continued need for a power Schottky diode having improved reverse performance.

SUMMARY OF THE INVENTION

Embodiments of the present technology are directed toward devices and method of manufacturing devices having improved avalanche breakdown characteristics. In one embodiment, the devices include three semiconductor layers, a guard region, a termination region and a first and second metal layer. The first semiconductor layer has a first concentration of dopant of a first type. The second semiconductor layer is disposed on a first side of the first semiconductor layer, and has a graded concentration of dopant of the first type. The third semiconductor layer is disposed on the second semiconductor layer opposite the first semiconductor layer, and has a second concentration of dopant of the first type that is less than the first concentration of dopant. Furthermore, the graded concentration of the second semiconductor layer is between the first concentration and second concentration of dopant. The guard region is disposed on the third semiconductor layer opposite the second semiconductor layer, and has a first concentration of dopant of a second type. The metal layer is disposed on the third semiconductor layer opposite the second semiconductor layer and proximate the guard region. The metal layer forms a Schottky junction with the second semiconductor layer.

In another embodiment, a method of fabricating the devices includes forming a second semiconductor layer on a first semiconductor layer, wherein the first semiconductor layer has a first concentration of a first dopant type. A third semiconductor layer is then formed on the second semiconductor layer. The third semiconductor layer has a second concentration of the first dopant type that is less than the first dopant concentration. In addition, the second semiconductor layer has a graded concentration of the first dopant type that is substantially equal to the second dopant concentration proximate the third semiconductor layer and greater than the second dopant concentration proximate the first semiconductor layer. A guard region is then formed in the third semiconductor layer opposite the second semiconductor layer, wherein the guard region has a first concentration of a second dopant type. Thereafter, a metal layer is deposited on the third semiconductor layer opposite the second semiconductor layer and a portion of the guard region. The metal layer forms a Schottky junction with the third semiconductor layer.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Embodiments of the present technology include semiconductor devices having a buffer layer and methods of manufacturing the semiconductor devices. In particular, such semiconductor devices include a depletion junction, a peripheral region adjacent the depletion junction and a buffer layer. The buffer layer is adapted to reduce localization of avalanche breakdown proximate an interface between the depletion junction and the peripheral region. In particular, a graded doping profile of the buffer layer reduces localization of avalanche breakdown by reducing an electric field proximate the peripheral region.

The depletion junction may be a junction between a p-type and n-type semiconductor, or a junction between a semiconductor and a metal. Accordingly, in one implementation, the device may be a diode. In another implementation, the device may be a Schottky diode. In yet another implementation, the device may be a rectifier.

Figure 1:
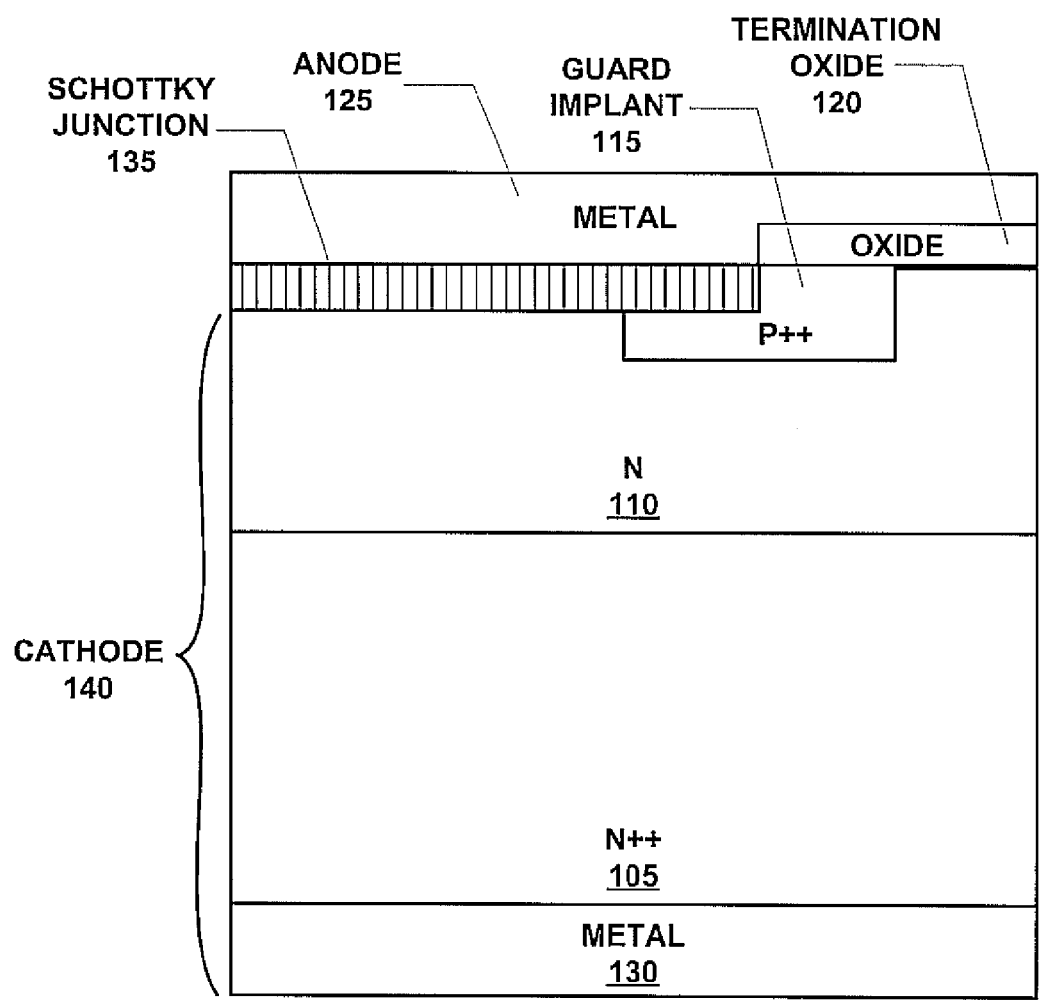
FIG. 1 shows a block diagram of a Schottky diode according to the conventional art.
Figure 2:
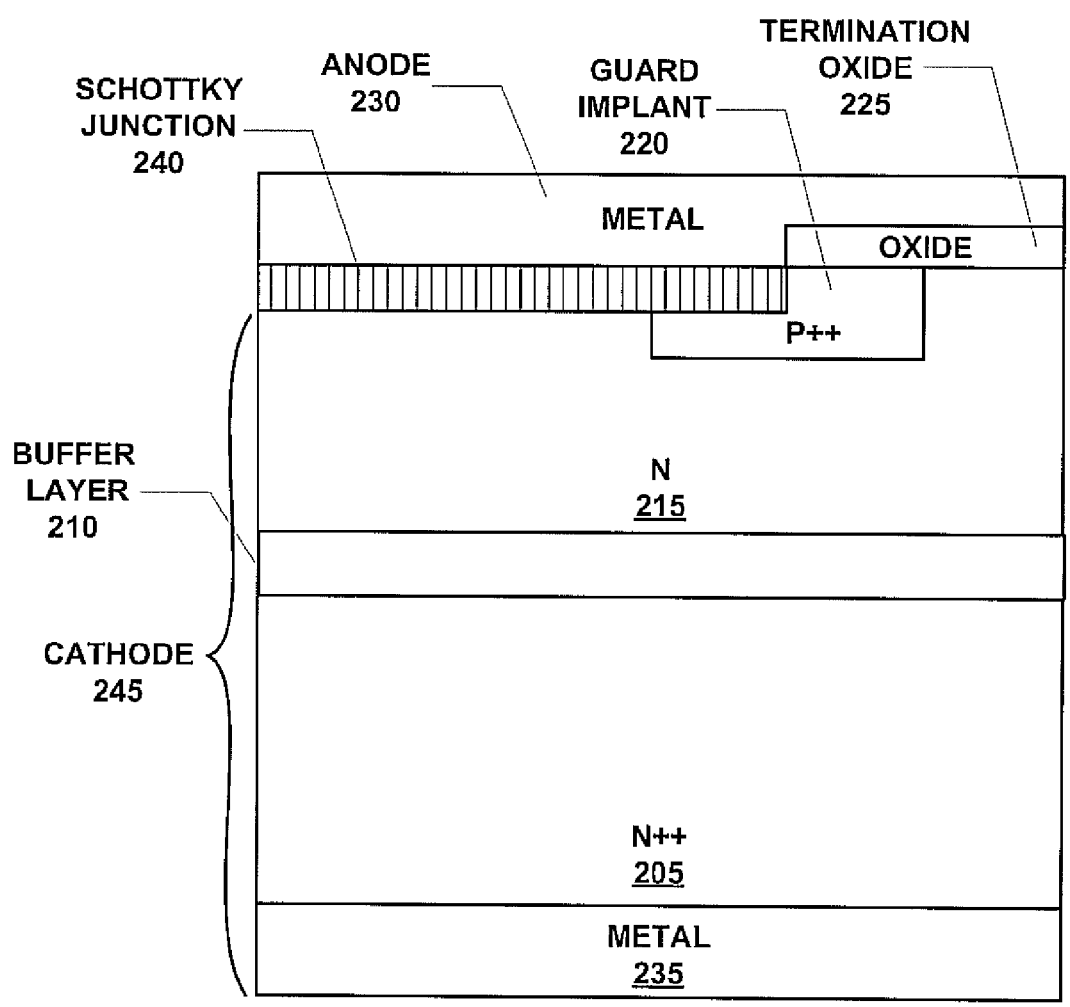
FIG. 2 shows a block diagram of a Schottky diode, in accordance with one embodiment of the present technology

Referring to FIG. 2, a Schottky diode, in accordance with one embodiment of the present technology, is shown. The Schottky diode includes a first semiconductor layer 205, a second semiconductor layer 210 also referred to as a buffer layer, a third semiconductor layer 215, a guard implant region 220, a termination oxide layer 225, an anode metal layer 230, and a cathode metal layer 235. The anode metal layer 230 and the doping concentration of the third semiconductor layer 215 are selected to form a Schottky junction 240 at the interface between the anode metal layer 230 and the third semiconductor layer 215. Accordingly, the third semiconductor layer 215, buffer layer 210, first semiconductor layer 205 and cathode metal layer 235 form the cathode 245 of the Schottky diode.

In a first implementation, the first semiconductor layer 205 may be silicon (Si) very heavily doped with phosphorous or arsenic (e.g., N++). The buffer layer 210 may be silicon doped with phosphorous or arsenic and has a graded doping profile across its width. The third semiconductor layer 120 may be silicon moderately doped with phosphorous or arsenic (e.g., N). The guard implant region 220 may be silicon very heavily doped with boron (e.g., P++). The width and smooth doping profile of the buffer layer 210 acts reduce the electric field proximate the guard implant region 220. Although embodiments of the present invention are described with reference to silicon, it appreciated that embodiments of the present invention may also utilize similarly doped type III-V compounds as the semiconductor materials.

In one implementation, the width of the buffer layer 210 may be approximately 10-45% of the width of the third semiconductor layer 215. The doping profile of the buffer layer 210 may be approximately linear and has a concentration approximately equal to the doping concentration in the third semiconductor layer 215 proximate the third semiconductor layer 215, and a peak concentration of approximately 5 to 20 times greater than the doping concentration of the third semiconductor layer 215 proximate the first semiconductor layer 105.

In a second implementation (not shown), the first semiconductor layer 205 may be silicon very heavily doped with boron (e.g., P++). The buffer layer 210 may be silicon doped with boron (P+) and has a graded doping profile across its width. The third semiconductor layer 215 may be silicon moderately doped with boron (e.g., P). The guard implant region may be silicon heavily doped with phosphorous or arsenic (e.g., N+).

The anode metal layer 230 may include a plurality of layers of metal, silicide and/or the like. In one implementation, a first layer (e.g., bottom layer) may include titanium (Ti), tungsten (W), platinum (Pt), copper (Cu), nickel (Ni), cobalt (Co), molybdenum (Mo) and/or the like, deposited on the surface of the third semiconductor layer 215 exposed by the termination oxide 225. A second layer (e.g., top layer) may include nickel-gold (Ni/Au), nickel-silver (Ni/Ag), aluminum (Al), copper (Cu) and/or the like deposited on the first layer. If the second layer includes aluminum, a third layer (e.g., middle layer) of titanium nitride (TiN), titanium (Ti), titanium tungsten (TiW) and/or the like may be deposited between the first and second layers of the anode metal 230. The second layer containing nickel-gold (Ni/Au), nickel-silver (Ni/Ag) and/or the like is adapted for making solder connections to the anode. The second layer containing aluminum (Al) and/or the like is adapted for making wire-bond connections to the anode.

Conventional power Schottky diodes in the 100 volt range are widely used for the design of switch-mode power supplies and other fields of power electronics where the devices operate close to their intrinsic limitation in term of maximum sustainable power during avalanche operation. The termination region is usually dimensional and designed just to sustain the desired breakdown voltage. Therefore, the capabilities of conventional Schottky diodes are limited by the reduced area of the termination region, which limits the overall reverse performance of the device.

More specifically, the reverse biased safe operating area (RBSOA) of conventional Schottky diodes is mainly limited by a double injection phenomenon. The buffer layer 210 of the present technology is adapted to smooth the electric field transition from the first semiconductor layer 205 to the third semiconductor layer 215. A smooth electric field transition limits the double injection phenomenon and related negative resistance which is the eventual cause of device failure. In fact, the presence of a smoother charge transition between the first and third semiconductor layers 205, 215 reduces the peak electric field proximate the guard implant 220 and therefore prevents the onset of negative resistance and current focalization. The doping width and profile of the buffer layer 210 may be controlled to optimize the tradeoff between the increase of avalanche capability and the forward operation of the device.

Figure 3A:
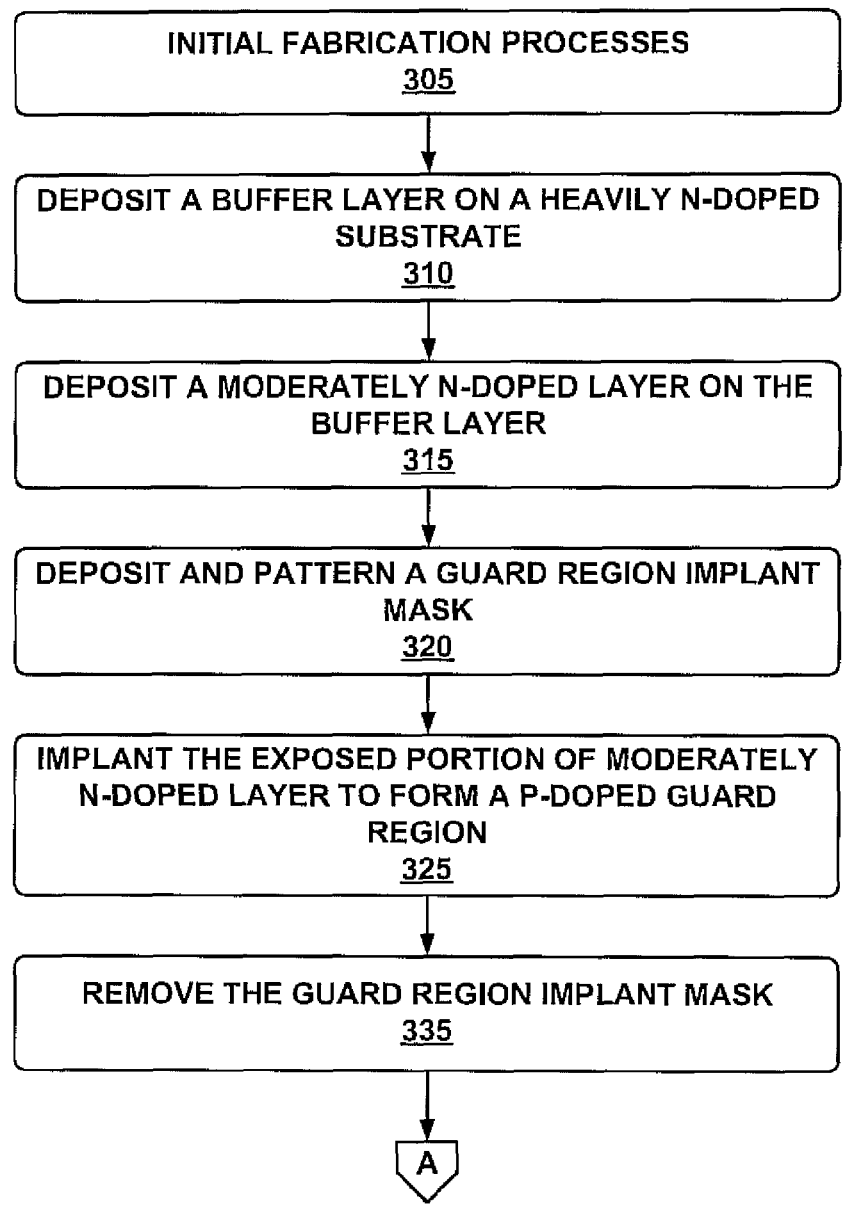
FIGS. 3A and 3B show a flow diagram of a method of fabricating a Schottky diode, in accordance with one embodiment of the present technology.
Figure 3B:
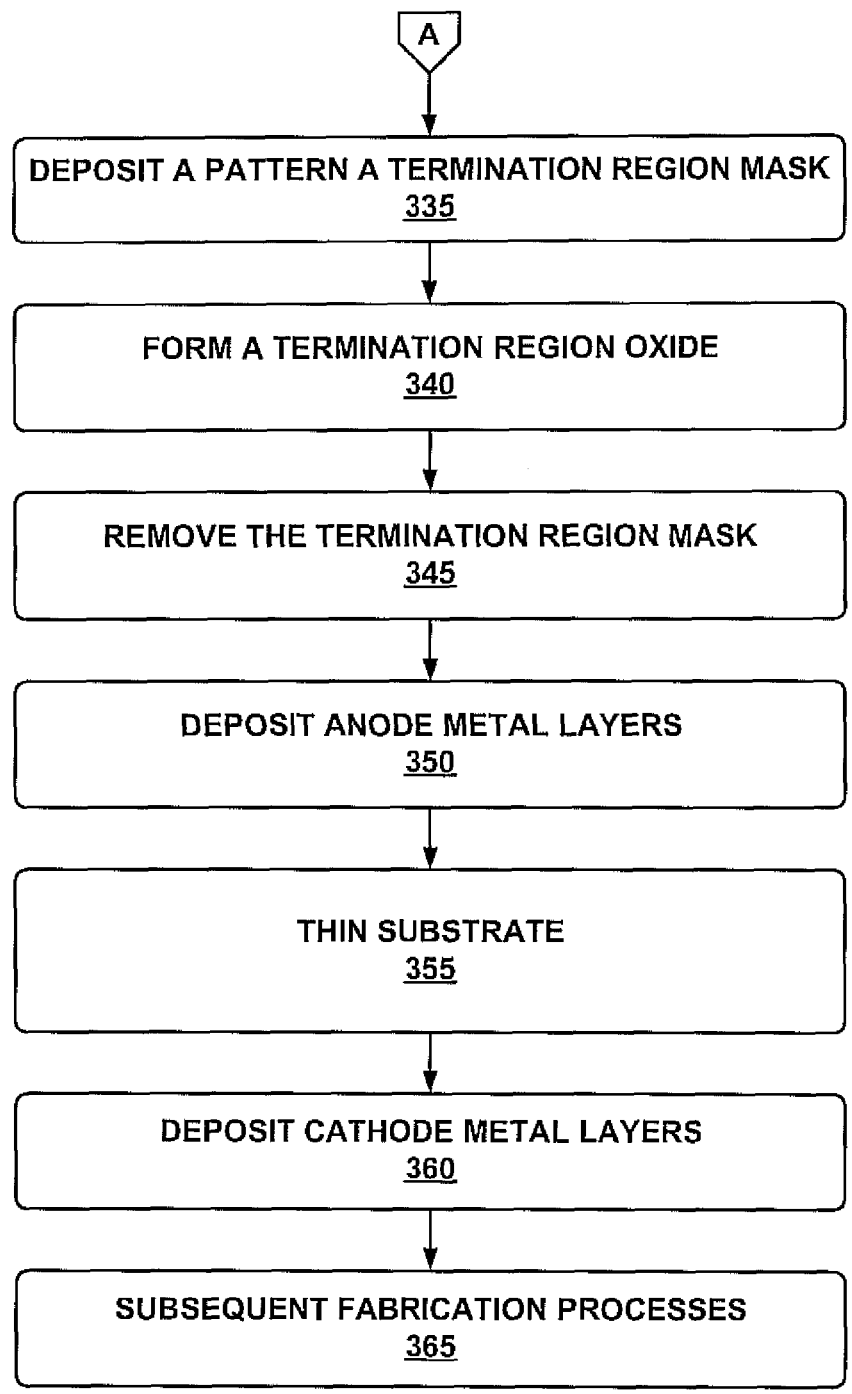

Referring now to FIGS. 3A and 3B, a method of fabricating a Schottky diode, in accordance with one embodiment of the present technology, is shown. The fabrication process may begin, at 305, with various initial processes upon a semiconductor substrate such as cleaning, depositing, doping, etching and/or the like. The substrate is also referred to herein as the first semiconductor layer. The substrate may contain a first type of dopant at a first concentration. In a first implementation, the substrate may be silicon very heavily doped with phosphorous or arsenic (N++), having a concentration in the range of approximately $1.0E17$ $cm^{-3}$ to $1.0E22$ $cm^{-3}$. In a second implementation, the substrate may be silicon very heavily doped with boron (P++). The first type of dopant may be introduced when the substrate is grown, or the dopant may be introduced by diffusion or implanting.

At 310, a second semiconductor layer, also referred to as a buffer layer, is formed on the substrate. The buffer layer contains the first type of dopant having a graded doping concentration. In one implementation, the buffer layer may be epitaxially deposited on the substrate. The epitaxial deposited buffer layer may be doped by introducing the dopant into the epitaxial chamber during deposition. The dopant deposited with the epitaxial semiconductor may have an initial concentration that is between the concentration of the substrate and a final concentration that is substantially equal to the concentration of the third semiconductor layer deposited in a subsequent process. In the first implementation, the buffer layer may be doped with phosphorous or arsenic having a concentration range of approximately $1.0E12$ $cm^{-3}$ to $1.0E18$ $cm^{-3}$. In an exemplary implementation, the doping concentration in the buffer layer is in the range of $5.0E15$ $cm^{-3}$ to $5.0E16$ $cm^{-3}$. In the second implementation, the buffer layer may be doped with boron.

At 315, a third semiconductor layer is deposited on the buffer layer. The third semiconductor layer may contain the first type of dopant at a second concentration. In one implementation, the third semiconductor layer may be epitaxially deposited on the buffer layer. The epitaxial deposited third semiconductor layer may be doped by introducing the dopant into the epitaxial chamber during deposition. In the first implementation, the third semiconductor layer may be moderately doped with phosphorous or arsenic (N) having a concentration in the range of approximately $1.0E12$ cm$^{-3}$ to $1.0E17$ cm$^{-3}$. In the second implementation, the third semiconductor layer may be moderately doped with boron (P).

At 320, a first photo-resist may be deposited and patterned by any well-known lithography process to form a guard region implant mask. At 325, the upper portion of the third semiconductor layer exposed by the guard region implant mask is doped with second type of dopant at a first concentration to form a guard region. In the first implementation, the resulting guard region may be very heavily doped with boron (P++) having a concentration of approximately $1.0E17$ cm$^{-3}$ to $1.0E22$ cm$^{-3}$. In the second implementation, the guard region may be very heavily doped with phosphorous or arsenic (N++). At 330, the guard region implant mask is removed utilizing an appropriate resist stripper or a resist ashing process.

At 335, a second photo-resist may be deposited and patterned by any well-known lithography process to form a termination region mask. At 340, a dielectric layer is formed on the portion of the third semiconductor layer exposed by the termination region mask. In one implementation, the dielectric layer is formed by oxidizing the exposed surface of the silicon to form a silicon dioxide layer. The oxide layer and guard region implant form the termination region of the device. At 345, the termination region mask is removed utilizing an appropriate resist stripper or a resist ashing process.

At 350, a first metal, also referred to as an anode metal, may be deposited on the third semiconductor layer and dielectric layer to form an anode of the Schottky diode. The anode metal may be deposited by any well-known method, such as sputtering. The anode metal may include a plurality of layers of metal. In one implementation, a first metal layer may be titanium (Ti), tungsten (W), platinum (Pt), copper (Cu), nickel (Ni), cobalt (Co) and/or molybdenum (Mo), and is deposited on the second semiconductor layer. A second metal layer may be nickel-gold (Ni/Au), nickel-silver (Ni/Ag), aluminum (Al) and/or copper (Co) and is deposited on the first layer. The metal layers make an electrical contact with the exposed portion of the third semiconductor layer to form a Schottky junction.

It is appreciated that the substrate should be relatively thin to reduce the on-state resistance of the Schottky diode. Accordingly, the substrate may be thinned by a process such as back lapping the surface (e.g., backside) of the first semiconductor layer opposite the second and third semiconductor layers and the anode metal, at optional process 355. The substrate thinning process may include chemical mechanical polishing and/or etching the backside of the first semiconductor layer.

At 360, a cathode metal may be deposited on the backside of the first semiconductor layer. The cathode metal may be deposited by any well-known method, such as sputtering. In one implementation, the cathode metal may be nickel-gold (Ni/Au), nickel-silver (Ni/Ag) or aluminum (Al). At 365, fabrication continues with various other processes. The various processes typically include passivation, cleaving and/or the like.

Figure 4:
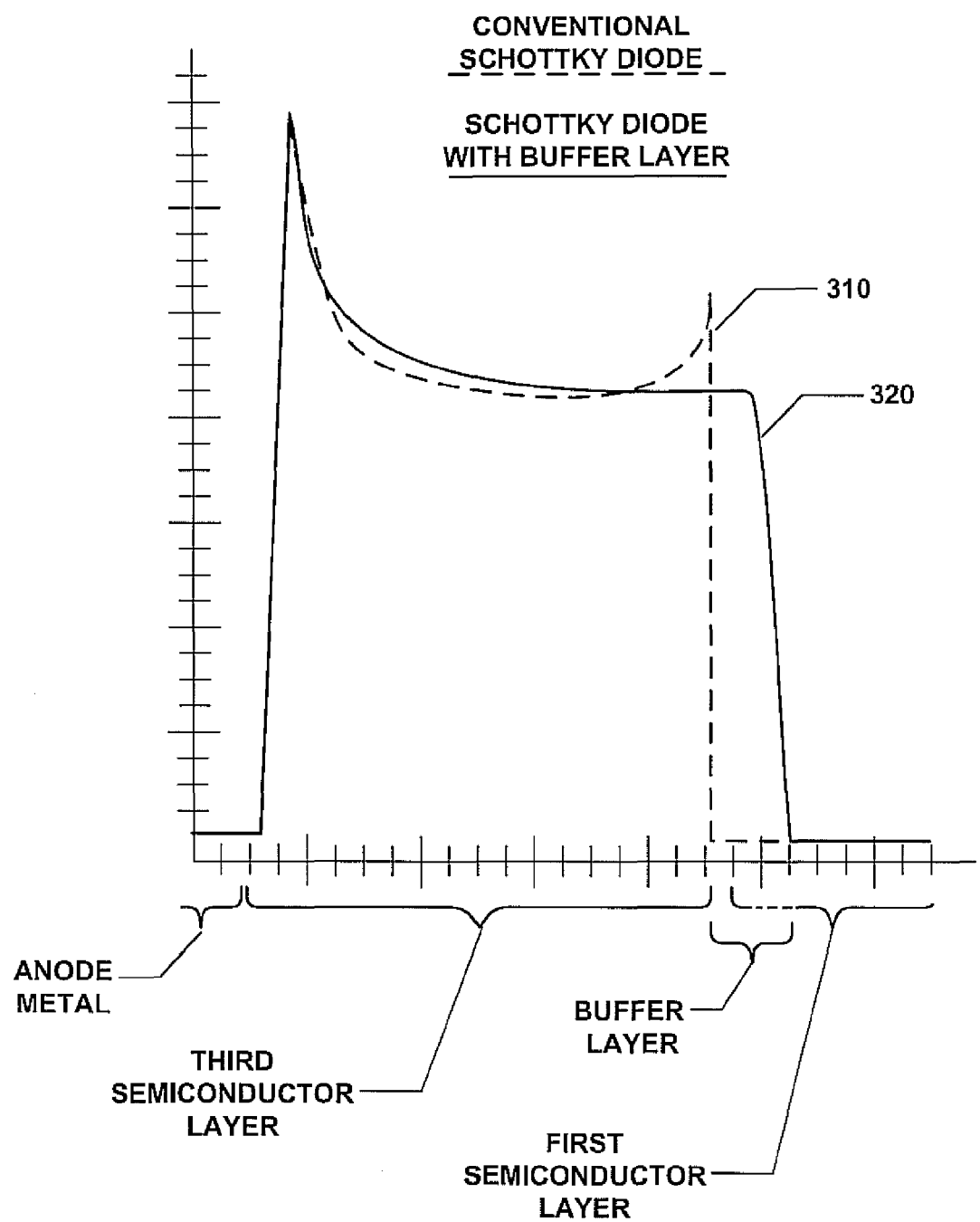
FIG. 4 shows an exemplary plot of the electric field characteristics across a conventional Schottky diode and a Schottky diode having a buffer layer.

Referring now to FIG. 4, an exemplary plot of the electric field characteristics across the semiconductor layer of a conventional Schottky diode and a Schottky diode having a buffer layer. The electric field for the conventional Schottky diode exhibits a peak 310 at the interface between the first and third semiconductor layers when operated at a current where double injection occurs. In comparison, the electric filed for the Schottky diode with buffer layer, in accordance with embodiments of the present technology, is smoothed out 320. It is appreciated that the plot in FIG. 4 is for illustrative purposes and do not represent particular Schottky diodes.

As described above, embodiments of the present technology provide a semiconductor device having a buffer layer. The buffer layer advantageously improves the maximum current and sustainable energy of the device. Accordingly, the semiconductor device with a buffer layer is characterized by an improved reverse biased safe operating capability without appreciably impairing the forward behavior of the device.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A device comprising:
  a first semiconductor layer having a first concentration of dopant of a first type;
  a second semiconductor layer, disposed on the first semiconductor layer, and having a graded concentration of dopant of the first type;
  a third semiconductor layer, disposed on the second semiconductor layer opposite the first semiconductor layer, and having a second concentration of dopant of the first type that is less than the first concentration of dopant, wherein the graded concentration of the second semiconductor layer is between the first concentration of dopant and the second concentration of dopant, wherein the width of second semiconductor layer is between ten and forty five percent of the width of the third semiconductor layer, wherein the doping profile of the second semiconductor layer has a concentration approximately equal to the doping concentration in the third semiconductor layer proximate the third semiconductor layer, and wherein the doping concentration of the second semiconductor layer is between five and twenty times greater than the doping concentration of the third semiconductor layer proximate the first semiconductor layer;
  a guard region, disposed in the third semiconductor layer opposite the second semiconductor layer, and having a concentration of dopant of a second type, wherein the width and smooth doping profile of the second semiconductor layer reduces an electric field proximate the guard region; and
  a first metal layer, disposed on the third semiconductor layer opposite the second semiconductor layer proximate the guard region and forming a Schottky junction with the third semiconductor layer.

2. The device of claim 1, wherein the graded concentration of the second semiconductor layer reduces the electric field proximate the Schottky junction.

3. The device of claim 1, wherein the graded concentration of the second semiconductor layer reduces a double-injection phenomenon proximately the Schottky junction.

4. The device of claim 1, wherein:
  the dopant of the first type comprises phosphorous or arsenic; and
  the dopant of the second type comprises boron.

5. The device of claim 4, wherein:
the concentration of dopant in the first semiconductor layer is in the range of approximately $1.0E17 \text{ cm}^{-3}$ to $1.0E22 \text{ cm}^{-3}$;
the concentration of dopant in the second semiconductor layer is in the range of approximately $1.0E12 \text{ cm}^{-3}$ to $1.0E17 \text{ cm}^{-3}$; and
the concentration of dopant in the guard region is in the range of approximately $1.0E17 \text{ cm}^{-3}$ to $1.0E22 \text{ cm}^{-3}$.

6. The device of claim 5, wherein the graded concentration of dopant in the second semiconductor layer proximate the first semiconductor layer is approximately in the range of $1.0E12 \text{ cm}^{-3}$ to $1.0E17 \text{ cm}^{-3}$, and proximate the second semiconductor layer is approximately in the range of $1.0E13 \text{ cm}^{-3}$ to $1.0E18 \text{ cm}^{-3}$.

7. The device of claim 1, wherein:
the dopant of the first type comprises boron; and
the dopant of the second type comprises phosphorous or arsenic.

8. A semiconductor device comprising:
a depletion junction;
a peripheral region adjacent the depletion junction; and
a buffer layer for reducing localization of avalanche breakdown proximate an interface between the depletion junction and the peripheral region, wherein the width and a smooth graded doping profile of the buffer layer reduces an electric field proximate the peripheral region adjacent the depletion junction.

9. The semiconductor device of claim 8, wherein the depletion junction comprises a junction between a p-type semiconductor and an n-type semiconductor.

10. The semiconductor device of claim 8, wherein the depletion junction comprises a junction between a semiconductor and a metal.

11. The semiconductor device of claim 8, wherein the buffer layer comprises a substantial linear doping profile.

12. The semiconductor device of claim 11, wherein the smooth graded doping profile of the buffer layer reduces localization of avalanche breakdown proximate the interface.

13. The semiconductor device of claim 8, wherein the semiconductor device comprises a diode.

14. The semiconductor device of claim 8, wherein the semiconductor device comprises a Schottky diode.

15. The semiconductor device of claim 8, wherein the semiconductor device comprises a rectifier.

* * * * *